United States Patent [19]
Makie et al.

[11] Patent Number: 5,136,529
[45] Date of Patent: Aug. 4, 1992

[54] DIGITAL SIGNAL WEIGHTING PROCESSING APPARATUS AND METHOD

[75] Inventors: Keiko Makie, Tokyo; Shinya Kuriki, Sapporo, both of Japan

[73] Assignee: Hitachi, Ltd., Tokyo, Japan

[21] Appl. No.: 588,717

[22] Filed: Sep. 27, 1990

[30] Foreign Application Priority Data

Sep. 29, 1989 [JP] Japan ................................ 1-251892

[51] Int. Cl.$^5$ .............................................. G06F 15/20
[52] U.S. Cl. ...................................... 364/581; 364/575
[58] Field of Search ............... 364/581, 575, 572, 554, 364/571.02, 574, 413.17, 724.01, 724.05, 734, 487; 375/99, 103

[56] References Cited

U.S. PATENT DOCUMENTS 4,117,538 9/1978 Shrader et al. ...................... 364/581

OTHER PUBLICATIONS

Introduction to Digital Signal Processing; Maruzen Publishing; 1985; p. 93.

Primary Examiner—Parshotam S. Lall
Assistant Examiner—Michael Zanelli
Attorney, Agent, or Firm—Antonelli, Terry, Stout & Kraus

[57] ABSTRACT

A digital signal weighting processing apparatus and method comprising a sampling section responsive to a measurement start signal for starting the measurement of an input signal and outputting sample values, a sample value storage section for storing these sample values in synchronism with each measurement of a single time, a weighting coefficient generation section for receiving said sample values each time the measurement of a single time is made, discriminating the magnitude of respective sample values and calculating weighting coefficients for each measurement of a single time, a weighting coefficient storage section for storing the weighting coefficients of each measurement of a single time outputted from the weighting coefficient generation section by the number of times of measurement, and a weighting section for successively reading out sample values at the same sampling time point each time the measurement of a single time is made and weighting the sample values by weighting coefficients corresponding to the number of times of measurement stored in the weighting coefficient storage section to conduct arithmetical mean operation.

25 Claims, 9 Drawing Sheets

— □ — WITH SIGNAL COMPONENT EXCLUDED
— △ — WITH SIGNAL COMPONENT CONTAINED

DIGITAL SIGNAL WEIGHTING PROCESSING APPARATUS AND METHOD

BACKGROUND OF THE INVENTION

The present invention relates to a weighting processing apparatus for digital signals and a weighting method thereof, and in particular to a digital signal weighting processing apparatus and a weighting method suitable for detecting weak signals in response to a measurement start signal of a medical appliance, an analyzer or the like.

If noise contained in a measured signal is white noise in case a weak signal is to be measured out of noise, noise can be reduced by taking the arithmetical mean value of these detected values.

Therefore, an arithmetical mean method whereby an arithmetical mean operation of sample values is conducted in synchronism with a measurement start signal to improve the signal-to-noise ratio is used for signal processing. Such an arithmetical mean method is described in "Digital Shingo Shori Nyumon" ("Introduction to digital Signal Processing", published in 1985 by Maruzen,) p. 93, for example. Assuming that, in such a prior method, sampling is performed at m points of time in each of a series of signal measurements performed n times, for example, these measurement results 1 to m are referred to as a measurement signal of a single time. In accordance with the prior art, a measurement comprising sampling 1 to m is repeated n times and the resultant m×n sample values undergo arithmetical mean processing.

In the case of a brain magnetic field measurement, for example, the above described arithmetical mean operation is conducted in synchronism with stimuli supplied to a living body. The resultant signal can be represented as $$\overline{V_j} = 1/n \cdot \Sigma V_{ij} \quad (1)$$

where $\Sigma$ represents an addition performed n times.

In such a method to obtain the mean value in the prior art, sample values $V_{1j}$ to $V_{nj}$ at, say, the j-th sampling points based upon m sample signals contained in each of the measured signals resulting from measurements made n times in synchronism with the measurement start signal are added in an adder circuit and the resultant sum is divided by the number n of input signals, which is the number of times of measurement. If noise components contained in the measured signals are white noise. The noise components become relatively small by conducting the arithmetical mean operation. Signal detection by using the prior art method is thus made possible.

In case noise components contained in measured signals vary relatively largely for every measuring point and a large noise component is present in a certain specific measured signal as compared with signals at other measurement points of time, however, the result of the arithmetical mean operation is affected by this large noise component, resulting in a significantly lowered signal-to-noise ratio.

SUMMARY OF THE INVENTION

Therefore, an object of the present invention is to provide a digital signal weighting processing apparatus and a weighting processing method capable of improving the signal-to-noise ratio without being affected by noise components even in case levels of noise components contained in measured signals largely vary.

In a digital signal weighting processing apparatus according to the present invention, weighting coefficients of an arithmetical mean operation are changed in synchronism with the measurement start signal each time measurement is made on the basis of a relative magnitude when summing sample values at the same point of time. Thereby the weighting coefficient of a measured signal of a measurement time of a sample value having a large noise component is lowered to increase the signal-to-noise ratio.

Further, in accordance with an embodiment of the present invention, the sample value at each measurement point of time undergoes a level decision. In case a sample value exceeding a predetermined threshold level is included, the weighting coefficient of that measurement time is set at "0" and addition of the sample value of that measurement time is prevented.

Further, in accordance with another embodiment, weighting coefficients are calculated from respective sample values by using the reciprocal of the variance of noises and weighting arithmetical mean processing is performed.

Further, in accordance with another embodiment, the standard deviation of noise of each sample value is generated and this value is used as a weighting coefficient to perform arithmetical mean processing.

Further, in accordance with still another embodiment, the approximate magnitude of the signal component is identified by conventional arithmetical mean processing. This signal component is subtracted from the sampled value beforehand to derive the noise component. After this processing, weighting is performed on the basis of a level decision with respect to a predetermined value or weighting coefficients are calculated on the basis of the reciprocal of the variance of noises and standard derivation of noises.

DESCRIPTION OF THE PREFERRED EMBODIMENTS

Figure 1:
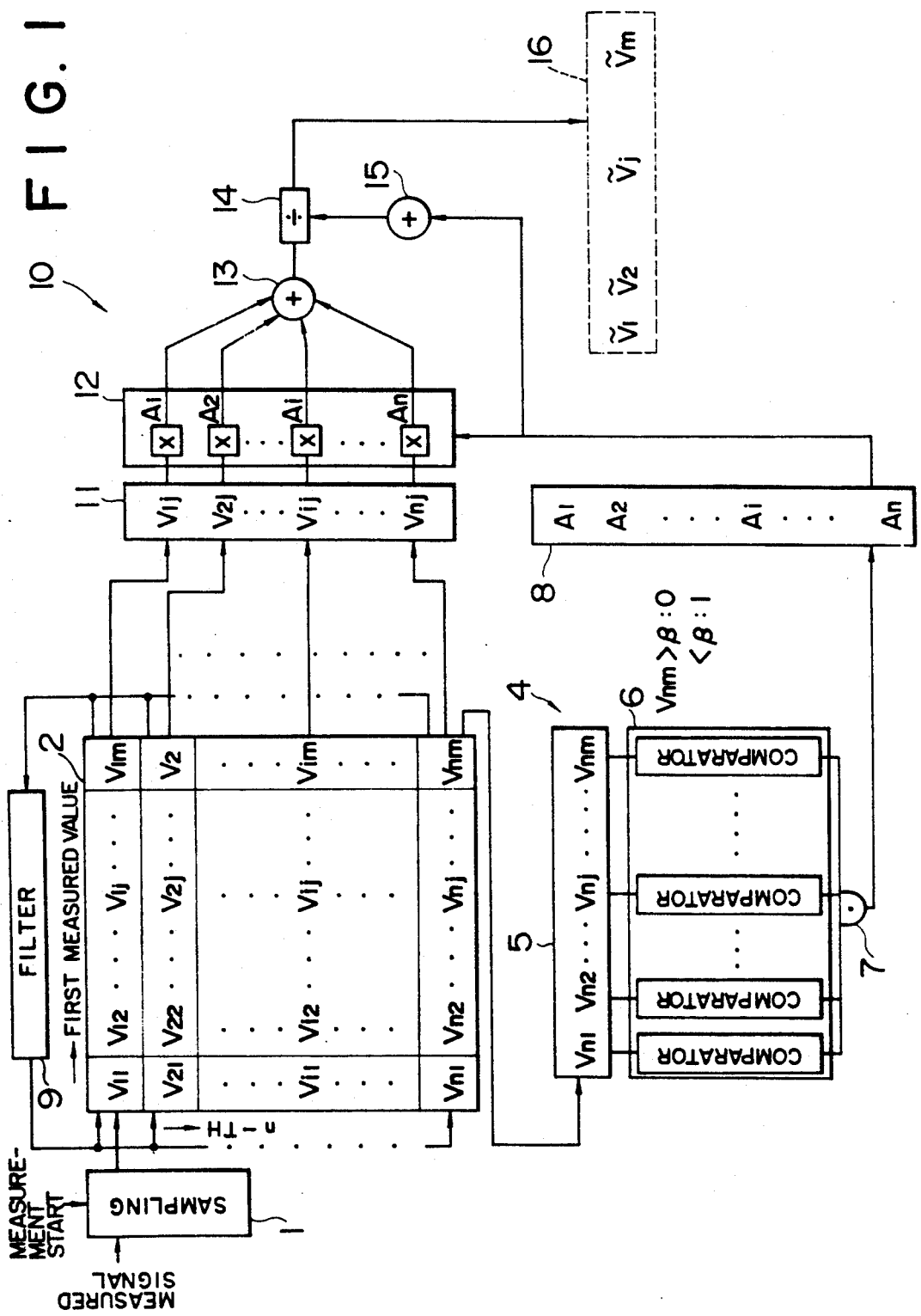
FIG. 1 is a functional configuration diagram showing an embodiment of the present invention.

The present invention will hereafter be described by referring to illustrated embodiments. FIG. 1 is a block configuration diagram of an embodiment of a digital signal weighting processing apparatus according to the present invention.

This weighting processing apparatus comprises a sampling circuit 1 responsive to an inputted measurement start signal for sampling an analog measured signal at m sampling points of time per measurement of a single time and for outputting sample values $V_{n1}$ to $V_{nm}$ at those points of time.

The output of this sampling circuit 1 is connected to a sample value buffer 2. When the first to n-th measurements are made, sample values $V_{11}$–$V_{1m}$ to $V_{n1}$–$V_{nm}$ are respectively stored into this sample value buffer 2.

A filter 9 is provided on the output side of the above described sample value buffer 2. This filter is, for example, a finite impulse response filter. This filter is so configured as to interrupt a frequency region, in which the signal component is not present, out of a measurement signal of a single time. By suitably selecting coefficients, which determines a cut off frequency, it is possible to make the filter 9 function as a high-pass filter or a low-pass filter. In case the frequency characteristic of the signal is evident or in case some noise is present outside the signal band, the effect of noise reduction can be enhanced by limiting the frequency region through the use of this circuit and then performing weighting arithmetical mean processing. The filtered sample values are re-stored into the sample value buffer 2.

Further, the output of the above described sampling circuit 1 is inputted to a weighting coefficient generation circuit 4 comprising a measured sample value register 5, a level decision unit 6 and a multi-input AND gate 7. In this weighting coefficient generation circuit 4, sample values $V_{11}$–$V_{1m}$ to $V_{n1}$–$V_{nm}$ are inputted into the measured sample value register 5 respectively in the first to the m-th measurement and outputted to the level decision unit 6 connected to the output stage of the measured sample value register 5. This level decision unit 6 incorporates m comparators, each having a threshold value $\beta$ for comparison, in parallel corresponding to m, which is the number of sample values stored in the measured sample value register 5 as a result of measurement of a single time. The same predetermined threshold value $\beta$ is preset in these m comparators and compared with respective sample values. Each comparator is so configured as to output "0" in response to input of a sample value larger than the predetermined threshold value and output "1" in response to input of a sample value lower than the above described threshold value. Outputs "0" and "1" of the level decision unit 6 comprising m comparators are inputted to the multi-input AND gate 7 to undergo an AND operation. The result is stored into storage positions $A_1$ to $A_n$ of a weighting coefficient register 8 corresponding to the first to the m-th measurement. Outputs of the level decision unit 6 undergo the AND operation in the multi-input AND gate 7. If input values include at least one "0", i.e., a measured signal, which is almost the noise component because the signal component is typically weak, includes at least one sample value larger than the predetermined threshold value, the weighting coefficient of that measurement time is stored into the weighting coefficient register 8 as "0".

These sample values $V_{1j}$, $V_{2j}$, - - - , $V_{ij}$, - - - $V_{nj}$ processed in the filter are inputted to a weighting circuit 10. This weighting circuit 10 comprises a simultaneous sample value register 11 for storing sample values $V_{1j}$, $V_{2j}$, - - - $V_{ij}$, - - - $V_{nj}$, a product circuit 12, summing points 13 and 15, and a divider 14. Weighting coefficients $A_1$, $A_2$, - - - , $A_i$, - - - , $A_n$ stored into the weighting coefficient register 8 are loaded into n multipliers included in the product circuit 12, respectively. On the other hand, these weighting coefficients $A_1$, $A_2$, - - - , $A_i$, - - - , $A_n$ are outputted to the summing point 15 and added thereat. That is to say, signals having weighting coefficients "1" are inputted to this summing point 15 and added thereat, whereas "1" or "0" is inputted to each of multipliers included in the product circuit 12 as the multiplication coefficient. In the product circuit 12, therefore, each sample is multiplied by the coefficient "1" or "0" which is set. The results are added at the summing point 13. Thereafter, the resultant sum is divided in the divider 14 by the sum obtained in the adder 15. A weighted arithmetical mean value 16 is thus obtained.

Operation of the entire weighting processing apparatus having the configuration heretofore described will now be described on the basis of a flow chart shown in FIG. 2. First of all, the measurement start signal is inputted (step 201). The sampling circuit 1 samples the analog input measured signal at m points and stores respective sample values into the sample value buffer 2 (202). This measurement is performed each time the measurement start signal is inputted and n times in total. Respective sample values are stored into the sample value buffer 2 (step 203).

If measurement of n times has thus been finished, the sampled values are re-stored into the sample value buffer 2. In addition, the sampling circuit 1 outputs respective sample values to the measured sample value register 5 included in the weighting coefficient generation circuit 4 (step 202).

On the basis of the sample values stored in the measured sample value register 5, the weighting coefficient generation circuit 4 generates weighting coefficients of that measurement time by means of a level decision and an AND operation, and outputs and stores those weighting coefficients into the weighting coefficient register 8 (step 205). Then, weighting coefficients stored in the weighting coefficient register 8 are first loaded into the multiplier 12 and the summing point 15 included in the weighting circuit 10 (step 206).

When loading of weighting coefficients has been finished, first values $V_{11}$, $V_{21}$, - - - , $V_{i1}$, - - - , $V_{n1}$ of sample values obtained at the same sampling time points for measurement made n times are loaded. The values $V_{11}, V_{21}, ---, V_{i1}, ---, V_{n1}$ undergo weighting processing and obtain a mean value in the weighting circuit (steps 207 and 208).

These steps 207 to 208 are repeated m times, where m is the number of times of sampling. Weighted arithmetical mean values $\overline{V}_1, \overline{V}_2, ---, \overline{V}_j, ---, \overline{V}_m$ of measured values are thus generated (step 209).

In the above described embodiment, each weighting coefficient is a quantitative value "1" or "0". A processing method whereby each weighting coefficient is defined to be a continuously variable value between "1" and "0", for example, to further enhance the effect of weighting will now be described.

A sample value $V_{ij}$ of the i-th addition of the j-th sampling stored in the sample value buffer 2 of FIG. 1 can be related to a true signal $S_j$ and noise $N_{ij}$ by the following equation.

$$V_{ij} = S_j + N_{ij} \quad (2)$$

Assuming that the true signal in a j-th sample value is the same in the measured signal of every time and the weighting coefficient is Ai, the signal $\overline{V}_j$ obtained after the arithmetical mean operation can be expressed as $$\overline{V}_j = S_j + \frac{\Sigma A_1 \cdot N_{ij}}{\Sigma A_1} \quad (3)$$

where $\Sigma$ represents addition of measured signals performed n times.

Therefore, mean magnitude $VN_j$ of noise at the sampling point j can be represented by the following equation $$VN_j = \frac{\Sigma A_i \cdot N_{ij}}{\Sigma A_i} \quad (4)$$

Figure 3:
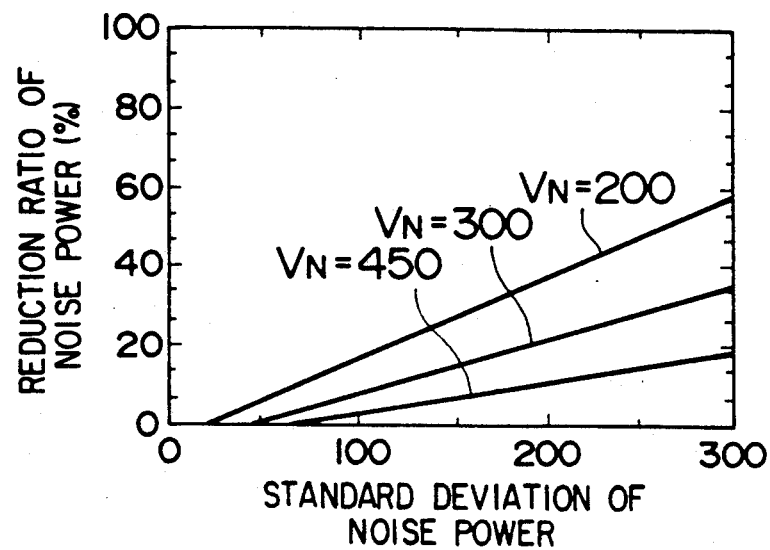
FIG. 3 is a characteristic diagram showing the relation between reduction ratio of noise power and standard deviation of noise power.

Then white noise is generated by a computer to compare the conventional addition with the weighted addition by means of simulation. Magnitudes of mean squared values of noise in both cases are examined to study the effect. The value of the weighting coefficient $A_i$ is so defined as to be equal to the reciprocal of the time average value of noise power of measured signals of a single time. FIG. 3 shows the result of simulation. The abscissa of FIG. 3 represents the standard deviation of time average value of noise power, and the ordinate represents the reduction ratio of noise power obtained by weighting addition. As the standard deviation increases, the reduction ratio of noise power increases. Values of VN shown in FIG. 3 represent mean values of noise power. As the mean value of noise power is reduced, the reduction ratio increases. It is evident from this result that weighting addition is effective when noise levels of measured signals are dispersed. It is also evident that weighting addition is effective as the mean value of noise power of measured signals of a single time is small. Therefore, the weighting addition is effective in improvement of signal-to-noise ratio.

Figure 4:
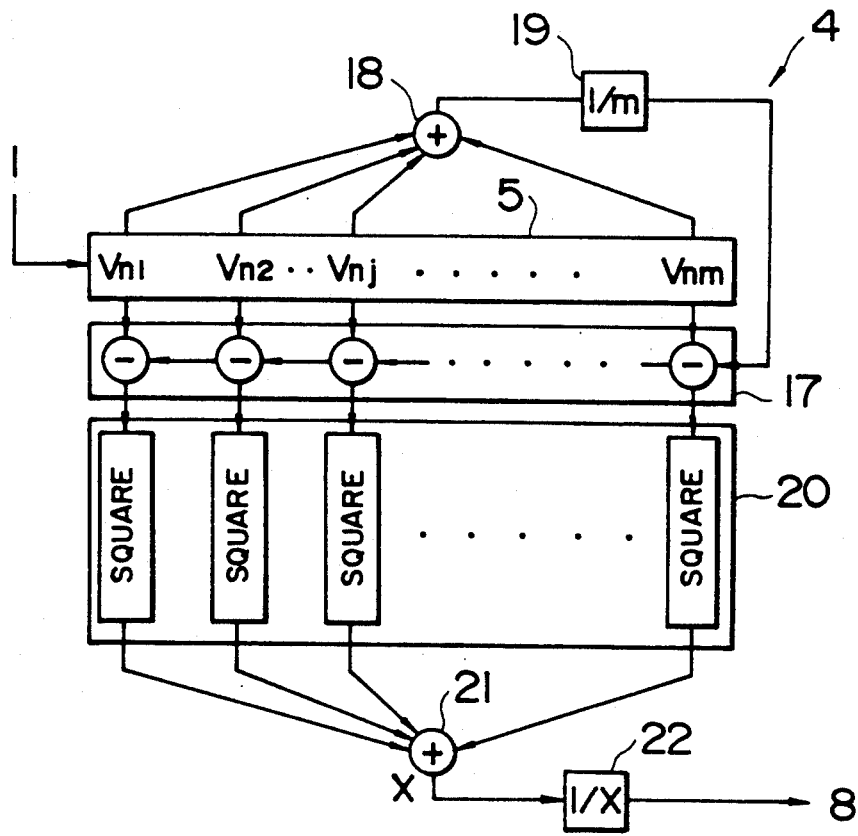
FIG. 4 is a functional block diagram in case a weighting coefficient generation circuit included in the configuration of FIG. 1 is so configured that weighting coefficients are generated by using the reciprocal of variance of noises.

An embodiment using this method is shown in FIG. 4. In the present embodiment, weighting coefficients are derived by using the reciprocal of noise variance. This embodiment has the same configuration as that shown in FIG. 1 with the exception of the configuration of the weighting coefficient generation circuit 4. Therefore, the configuration of the weighting coefficient generation circuit and its operation will now be described.

With reference to FIG. 4, the weighting coefficient generation circuit 4 comprises a measured sample value register 5 receiving m sample values of a single measurement from the sampling circuit 1. Respective values stored in this measured sample value register 5 are applied to a summing point 18 to yield their sum and they are also coupled to a subtraction circuit 17 comprising m subtracters. The above described sum of sample value signals derived at the summing point 18 is inputted to a divider 19 and then divided by the number m of sample values in the divider 19. The time average value of the measured signals thus derived is supplied to respective subtracters of the subtraction circuit 17. In this subtraction circuit 17, the difference value between the signal value measured at each point of time inputted from the above described measured sample value register 5 and the time average value outputted from the divider 19 is generated. Further, respective outputs of this subtraction circuit 17 undergo squaring operation in a squaring operation circuit 20 comprising m squaring elements. Outputs of the m squaring devices are added at a summing point 21. The reciprocal of the resultant sum is calculated in a reciprocal computing element 22. The output of the reciprocal computing element 22 which is the reciprocal of the noise variance is stored into the weighting coefficient register 8 as the weighting coefficient of this measurement point.

Figure 2:
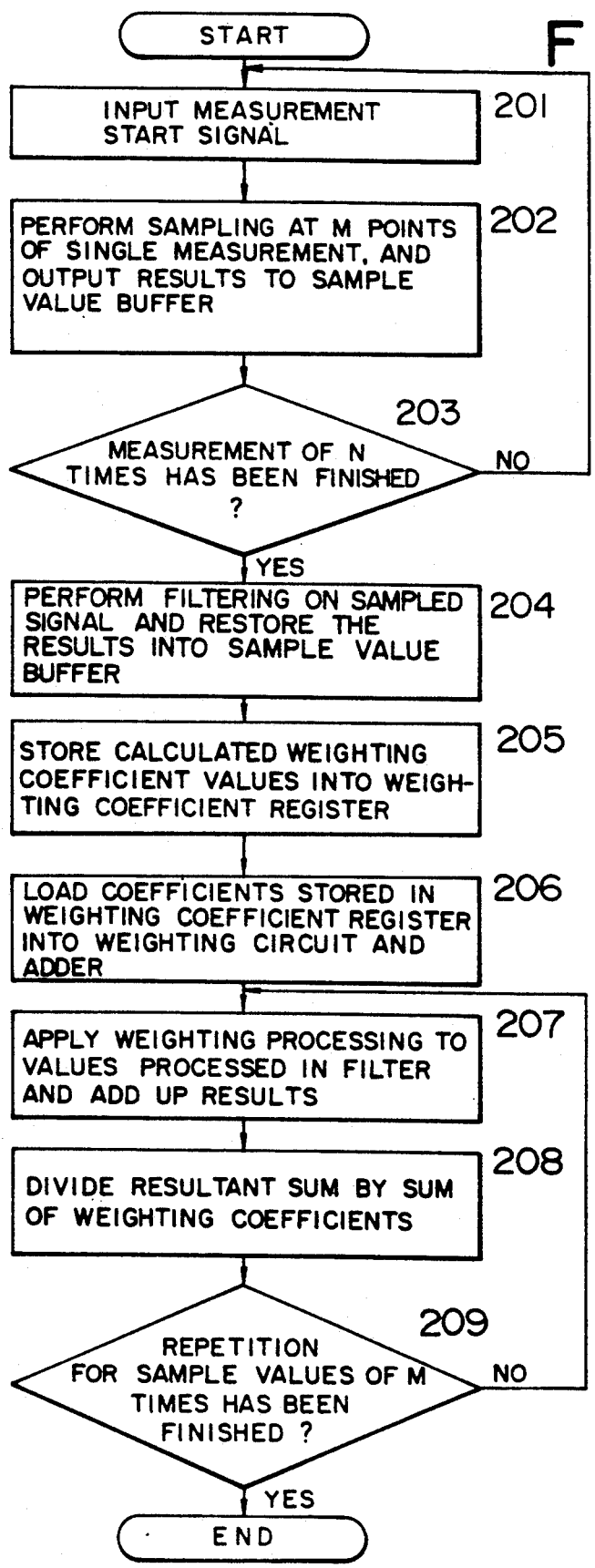
FIG. 2 is a flow chart showing the operation of the configuration of FIG. 1.
Figure 5:
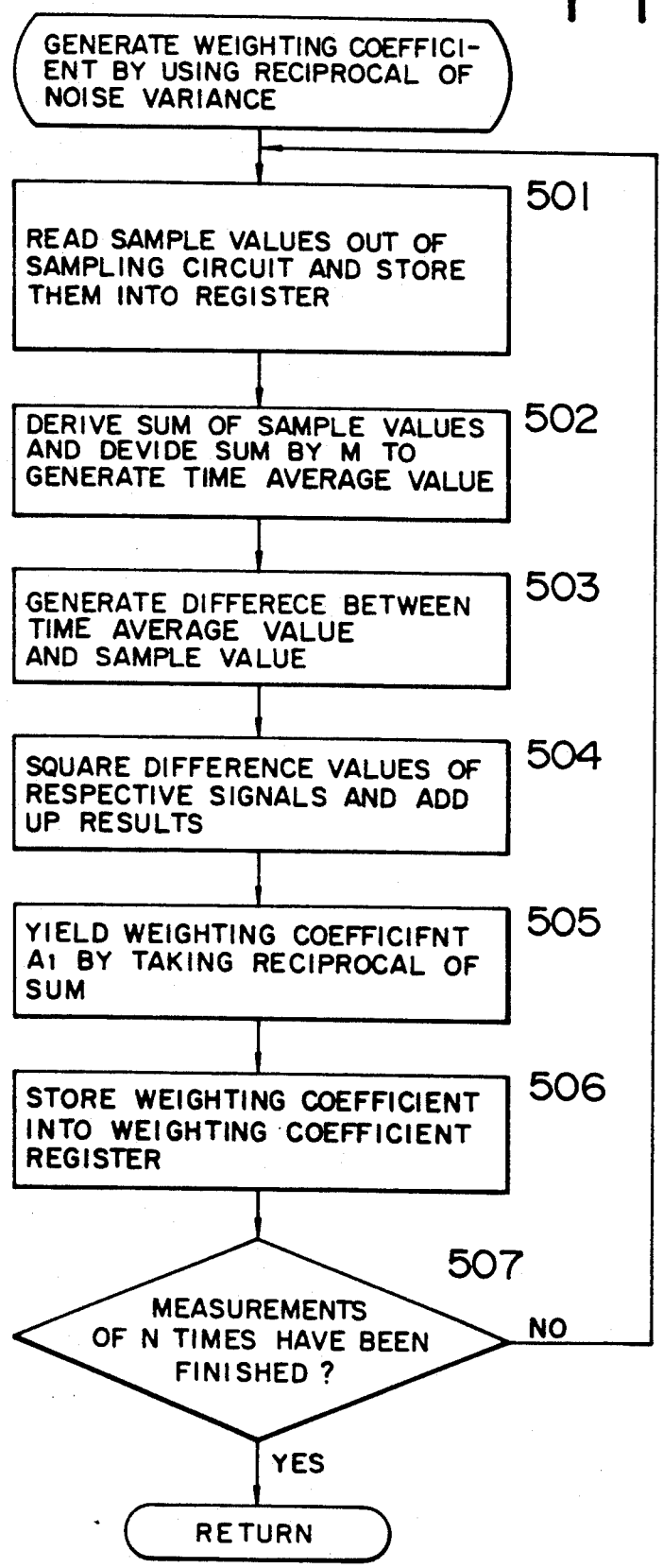
FIG. 5 is a flow chart showing the operation of the blocks illustrated in FIG. 4.

This embodiment shown in FIG. 4, in which weighting coefficients are generated by using the reciprocal of noise variance, can be implemented by executing a flow which is the same as that of FIG. 2 except that the steps 202 to 204 shown in the flow chart of FIG. 2 are replaced by steps 501 to 506 shown in FIG. 5. (However, the sample values are successively stored into the sample value buffer 2 in this case as well.)

This processing will now be described. In the weighting coefficient generation circuit 4, sample values are read out of the sampling circuit 1 and stored into the measured sample value register 5 (step 501). The sum of signals of sample values is derived at the summing point 18. Further, the time average value of measured signals is derived in the divider 19 (step 502). This time average value is inputted to the subtraction circuit 17, and the difference between this time average value and each sample value is generated (step 503). Further, these difference values are squared in the squaring circuit 20. The squared difference values are added at the summing point 21 (step 504). In the reciprocal computing element 22, the weighting coefficient $A_1$ is derived by taking the reciprocal of the resultant sum (step 505). The weighting coefficient $A_1$ thus generated is stored into the weighting coefficient register (step 506). The operation heretofore described is repeated for measurements of n times (step 507).

Figure 6:
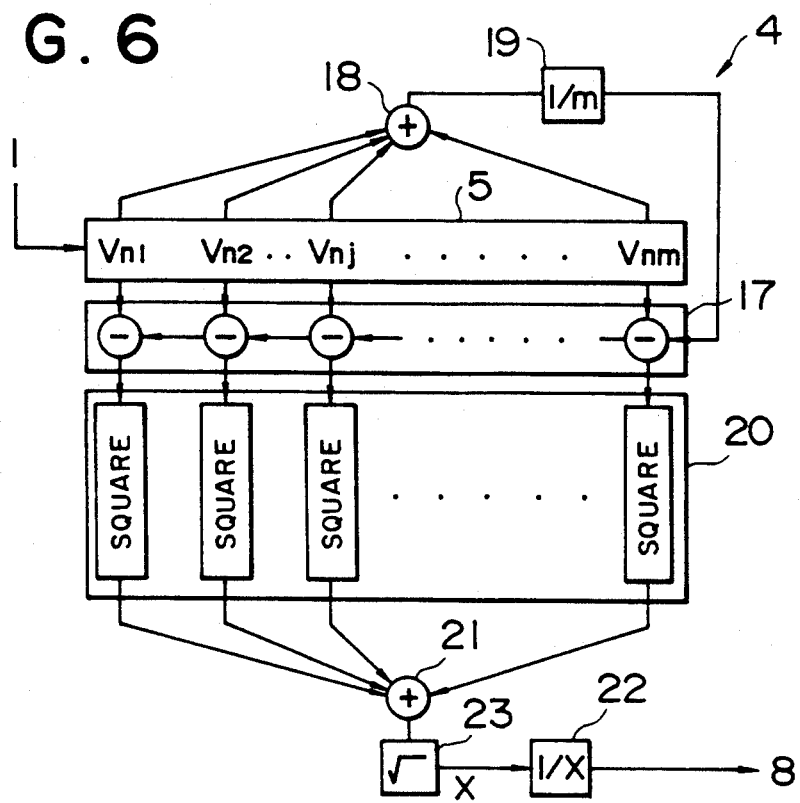
FIG. 6 is a functional block diagram in case the weighting coefficient generation circuit is so configured that weighting coefficients are generated by using the standard deviation of noises.

An embodiment of a weighting coefficient generation circuit which conducts weighting mean value operation by using the standard deviation of noise is shown in FIG. 6.

The configuration of this embodiment differs from that shown in FIG. 4 in that a root computing circuit 23 is disposed between the summing point 21 and the reciprocal computing element 22. After the root of the output of the summing point 21 is derived, its reciprocal is computed. The standard deviation of noise thus derived is outputted as the weighting coefficient. The remaining components of this embodiment have the same configuration as that of FIG. 4 and hence will not be described.

In the above described embodiments shown in FIGS. 1 to 6, weighting coefficients are defined by regarding the measured signal as noise. In the measured signal, however, a true signal is contained although it is weak. In a waveform having a small noise level, therefore, weighting coefficients are estimated to be small under the influence of the signal component. Thus, there is a fear that the effect of improvement of the signal-to-noise ratio is lowered. It is considered that it is effective in solving this problem and further improving the signal-to-noise ratio to subtract the approximate signal component and then define the weighting coefficients.

Figure 7:
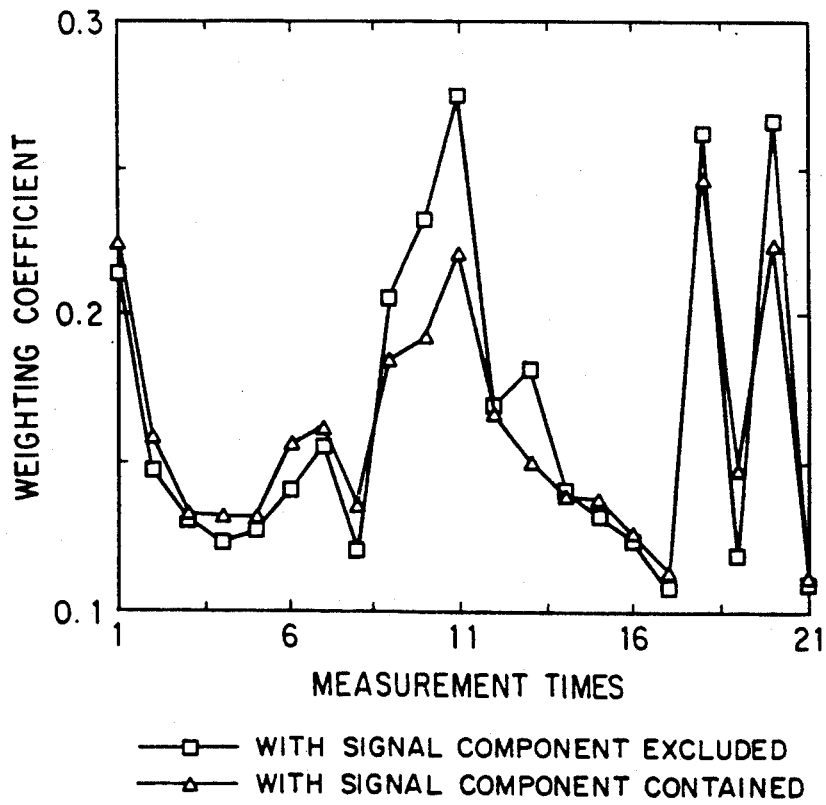
FIG. 7 is a diagram showing the relation between the weighting coefficient and the number of times of measurement in case the signal component in the sample value is included and in case the signal component in the sample value is excluded.

A signal component comprising a sine wave and white noise were generated by a computer. The influence of the signal component exerted on the weighting coefficient was studied by means of simulation. The result of this simulation is shown in FIG. 7. The weighting coefficient is defined to be the reciprocal of the noise variance. The abscissa of FIG. 7 represents the measurement No., whereas the ordinate represents the value of the weighting coefficient at each time. In FIG. 7, $\Delta$ represents the case where the weighting coefficient is defined by containing a true signal component, whereas $\square$ represents the case where the weighting coefficient is defined by excluding the signal component. In both cases, the weighting coefficients exhibit nearly the same change in accordance with the magnitude of noise contained in the measured signal. In case the approximate signal component is subtracted, however, the weighting coefficient of the measured waveform having a smaller noise level tends to be higher. As a result, the weight of a waveform having a small noise level becomes higher. Therefore, it is effective in improving the signal-to-noise ratio to identify and subtract the signal component and then conduct the weighting arithmetical mean operation.

Figure 8:
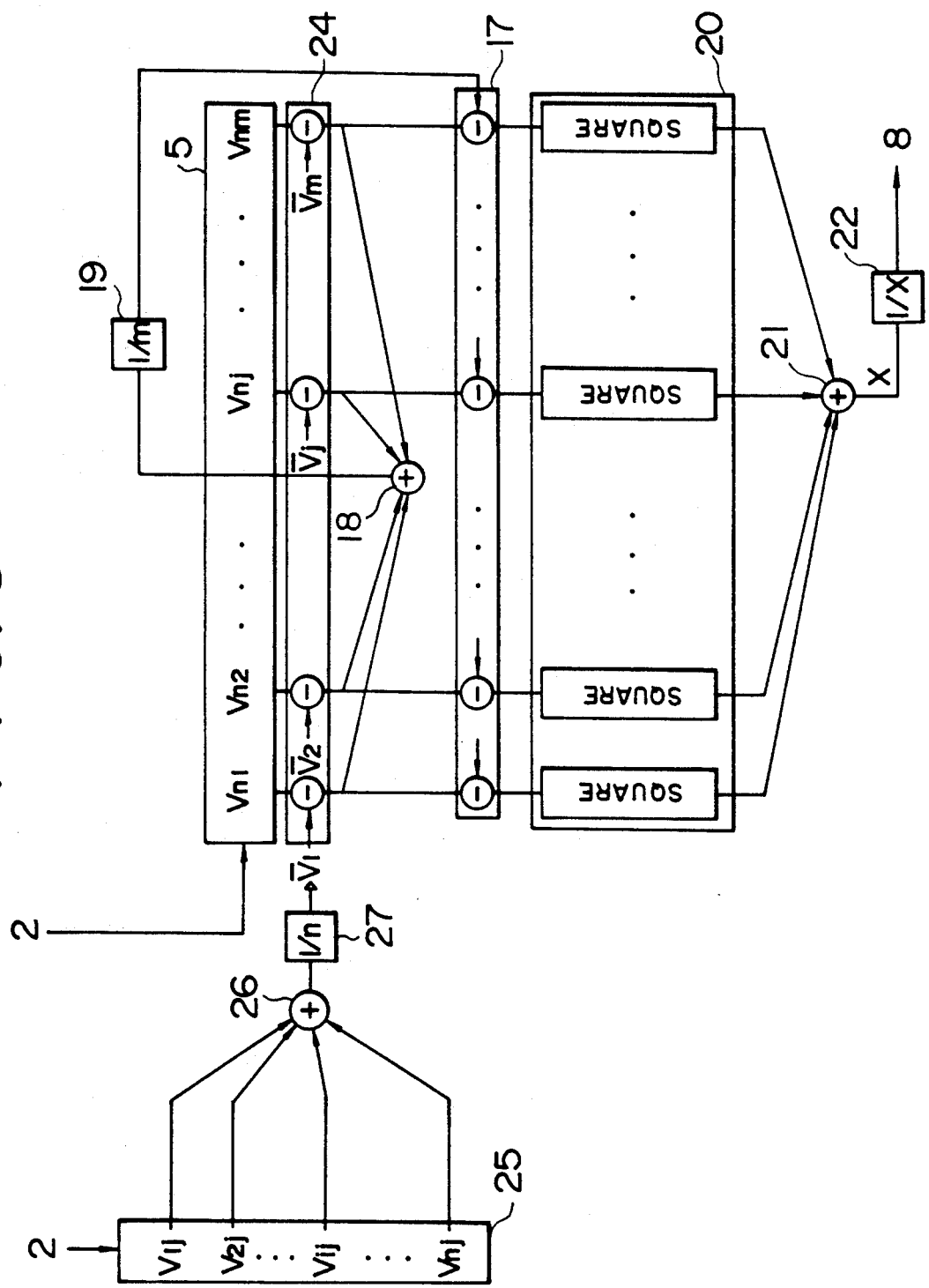
FIG. 8 is a variant of the configuration of FIG. 4 and it is a block configuration diagram for deriving the reciprocal of the variance of noises by using a noise component obtained after a signal component, which was derived beforehand by means of conventional arithmetical mean operation, is removed and for generating weighting coefficients.

An embodiment using this method is shown in FIG. 8. In this embodiment, weighting coefficients are defined by using the reciprocal of the noise variance and weighting arithmetical mean operation is conducted.

Unlike the weighting coefficient generation circuit of the embodiment shown in FIG. 4, the embodiment shown in FIG. 8 has a feature that after measurements of n times have been finished (where sample values of n times are successively stored into the sample value buffer 2), the approximate signal component is subtracted from the sample values of a single time read into a single-time measured value register 5 by using a subtraction circuit 24, the noise component being thus derived.

Succeeding processing is performed in the same way as the embodiment of FIG. 4. It is now assumed that the conventional technique of arithmetical mean operation is used to generate approximate signal components $\overline{V}_1$, $\overline{V}_2$, - - - , $\overline{V}_i$, - - - , $\overline{V}_m$. The configuration of the present embodiment further comprises a simultaneous sample value register 25 for storing sample values obtained at the same specific point and supplied from the sample value buffer 2, a summing point 26 for adding these sample values, and a divider 27 for dividing the output of the summing point 26 by the number n of times of measurement. The approximate signal components $\overline{V}_1$, $\overline{V}_2$, - - - , $\overline{V}_i$, - - - , $\overline{V}_m$ successively generated by this divider 27 are successively set into subtracters included in the subtraction circuit 24.

Figure 9:
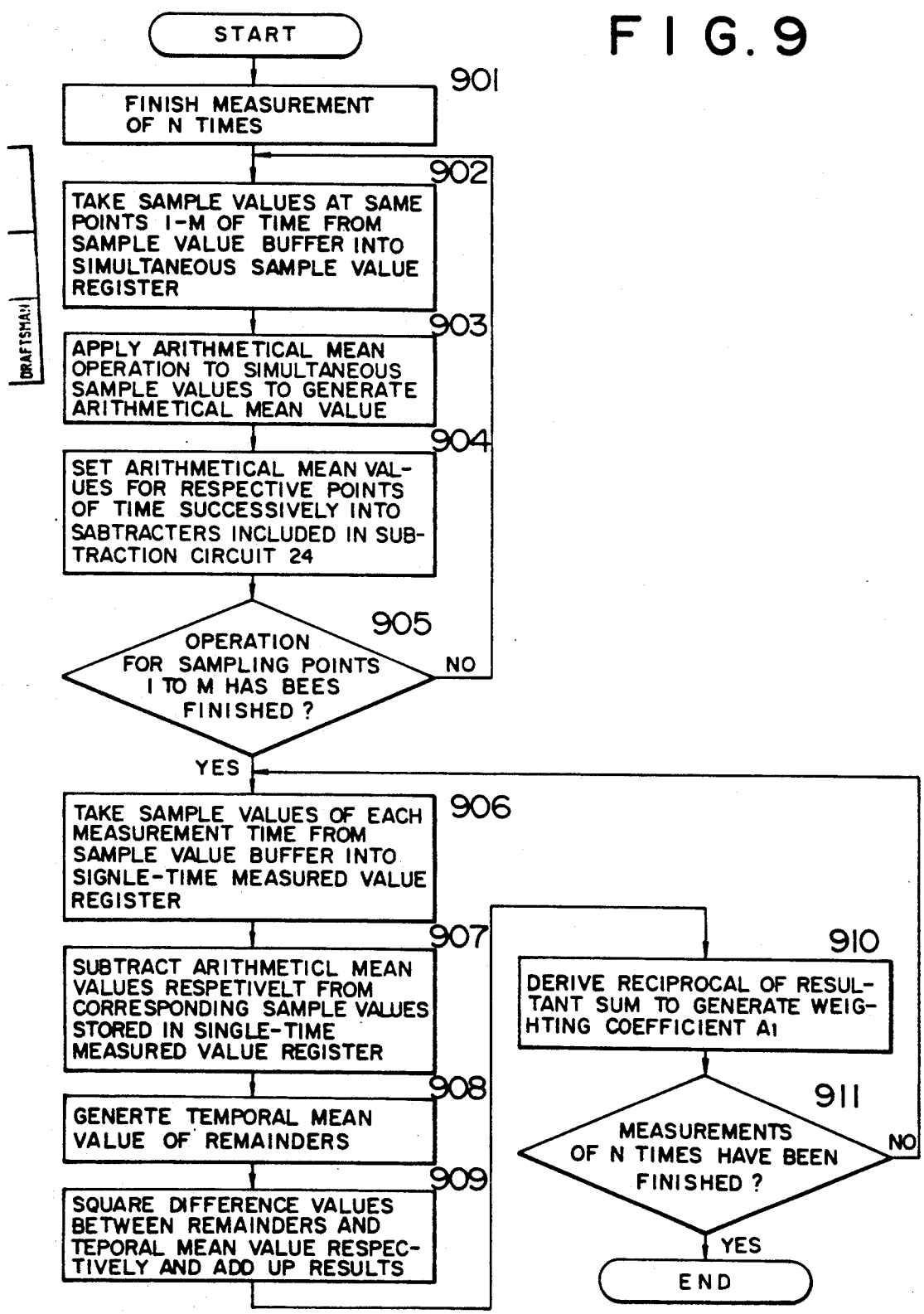
FIG. 9 is a flow chart for the configuration of FIG. 8.

Operation of the embodiment shown in FIG. 8 will now be described by referring to a flow chart shown in FIG. 9. The sampling circuit 1 has finished sampling of n times and all sample values are stored into the sample value buffer 2 (step 901). Simultaneous sample values are taken from the sample value buffer 2 into the simultaneous sample value register 25 (step 902). Arithmetical mean operation is applied to these simultaneous sample values and the mean value is thus generated (step 903). Mean values $\overline{V}_1$, $\overline{V}_2$, - - - , $/_i$, - - - , $\overline{V}_m$ for respective sampling points of time are successively set into subtracters included in the subtraction circuit 24 (step 904). If this operation has been completed for all of the sampling points 1 to m (step 905), sample values of measurement of the first time are first taken into the single-time measured value register 5 (step 906). The above described mean values set into the subtraction circuit are subtracted from those sample values (step 907). Thereafter, the time average value of resultant remainder values is generated with respect to the measured values of this time as described before with reference to the embodiment of FIG. 4 (step 908). Difference values between the remainders and the time average value are squared respectively and the resultant square values are added (step 909). Further, the weighting coefficient $A_1$ is generated by deriving the reciprocal of the resultant sum and the weighting coefficient $A_1$ is outputted to the weighting coefficient register 8 (step 910). Processing steps 906 to 910 heretofore described are repeated with respect to all sample values of measured signals 1 to n. It is thus possible to generate the weighting coefficient by using the reciprocal of noise variance with respect to noise components obtained by removing approximate signal components $\overline{V}_1 - \overline{V}_m$ from raw sample values beforehand.

Figure 10:
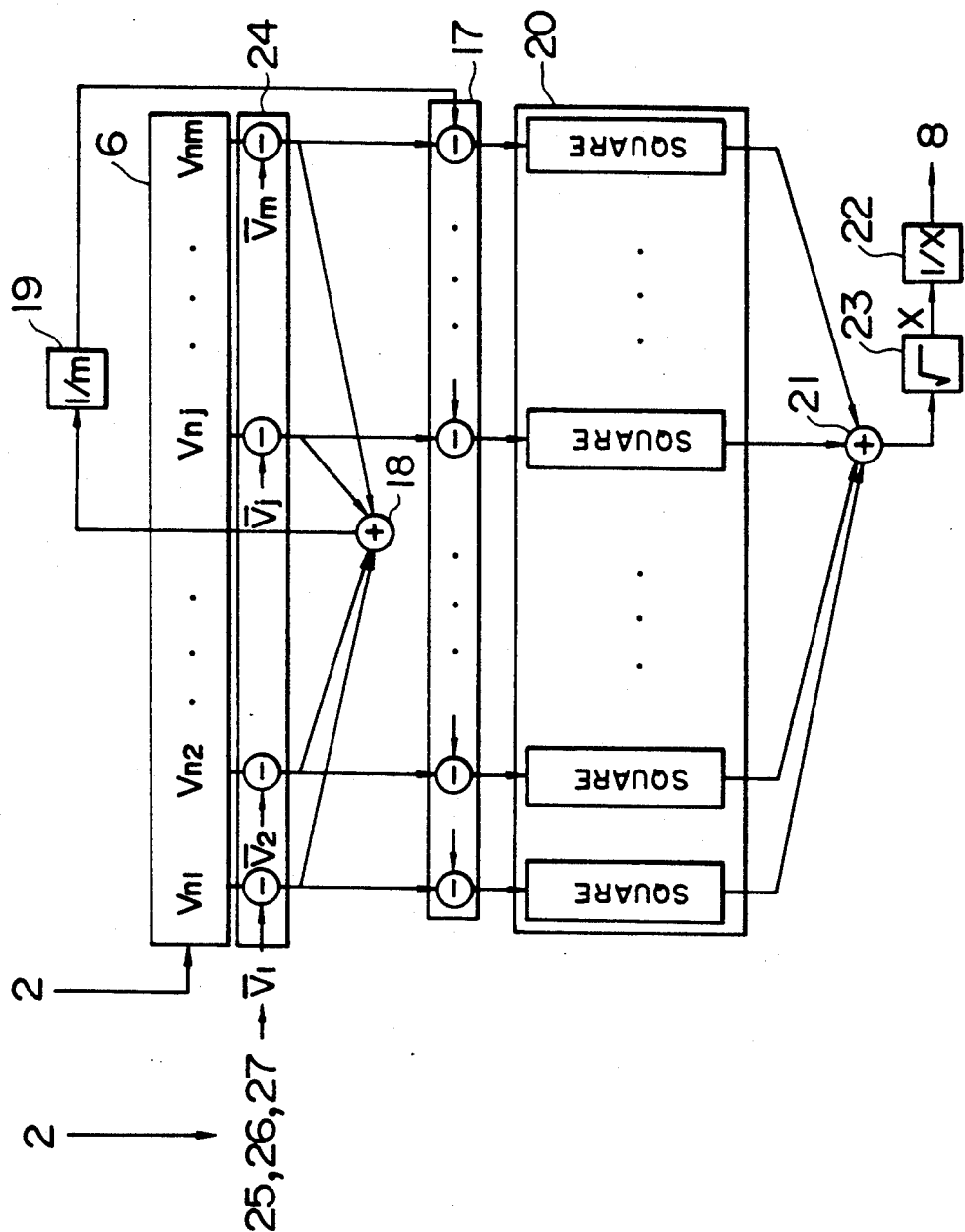
FIG. 10 is a variant of the configuration of FIG. 6 and it is a block configuration diagram for deriving the standard deviation of noises by using a noise component obtained after a signal component, which was derived beforehand by means of conventional arithmetical mean operation, is removed and for calculating weighting coefficients on the basis of the standard derivation of noises thus derived.

Although in the embodiment of FIG. 6 the weighting coefficients are generated from the standard deviation of noise, FIG. 10 shows an embodiment of a weighting coefficient generation circuit which removes signal components $\overline{V}_1 - \overline{V}_m$ beforehand and then generates weighting coefficients. In this embodiment as well, the approximate signal components $\overline{V}_1 - \overline{V}_m$ generated by conventional arithmetical mean generation means shown in FIG. 8 are set into respective computing elements included in the subtraction circuit 24 and are subtracted from sample values stored in the single-time measured value register. The remaining circuit configuration and operation are the same as those of the above described embodiment shown in FIG. 8 and will not be described.

Figure 11:
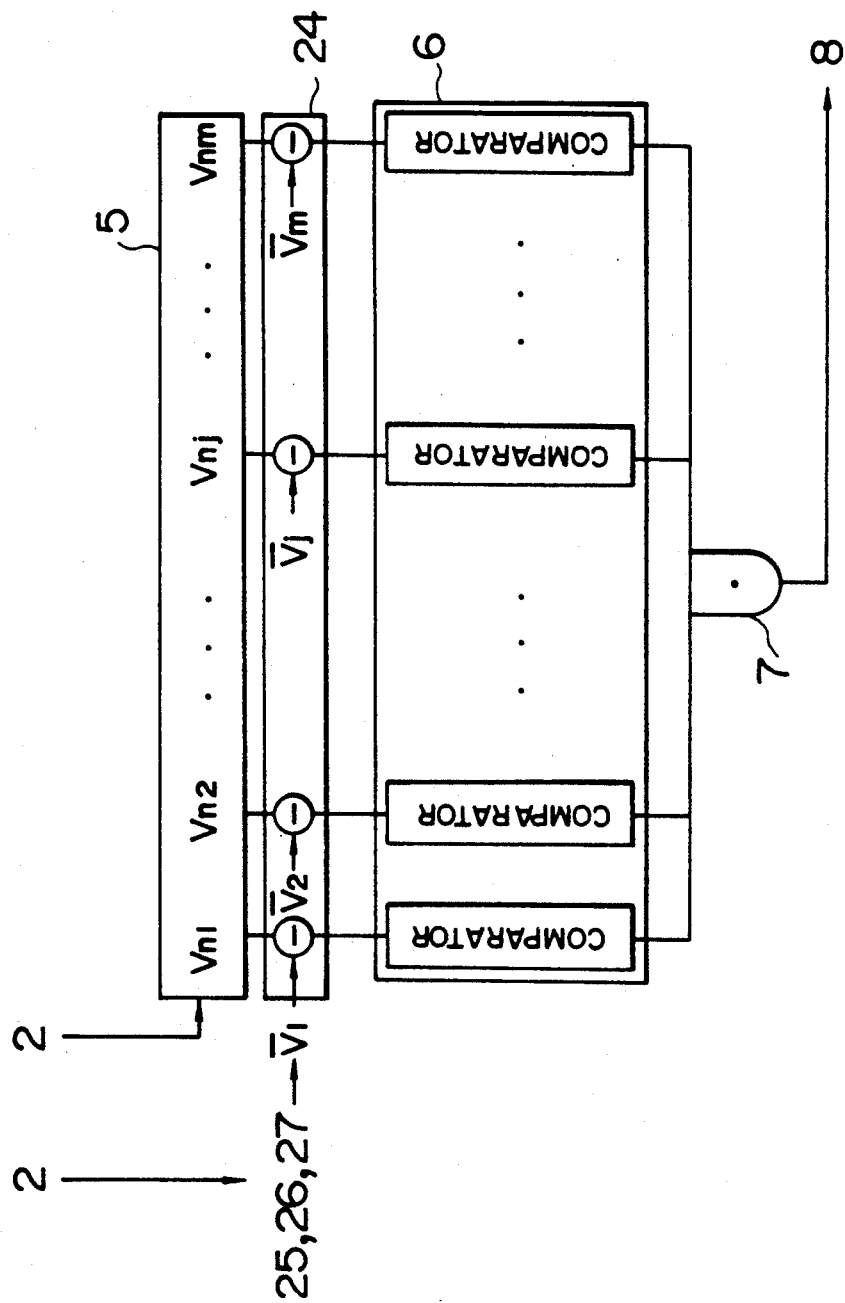
FIG. 11 is a block configuration diagram in which the weighting coefficient generation circuit makes a level decision with respect to the noise component with the signal component removed beforehand.

In the embodiment of FIG. 1 as well, it is a matter of course as exemplified in FIG. 11 that the weighting coefficient generation circuit may be so configured that a level decision will be made after subtraction of approximate signal components $\overline{V}_1 - \overline{V}_m$ generated by conventional arithmetical mean generation means as in the above described embodiment of FIG. 8 or 10.

In addition, as a means for generating the approximate signal components $\overline{V}_1 - \overline{V}_m$, other than conventional arithmetical mean generation means, a result of weighted mean generation generated by a weighting coefficients generation circuit as exemplified in FIGS. 1, 4 and 6, can be treated as the approximate signal components $\overline{V}_1 - \overline{V}_m$.

We claim:

1. A digital signal weighting processing apparatus comprising:

sampling means responsive to a measurement start signal for starting the measurement of an input signal to sample said input signal a predetermined number of times to effect a measurement of a single time and outputting a plurality of sample values obtained by said sampling of said input signal in synchronism with said measurement start signal each time said measurement of a single time is made;

sample value storage means for storing sets of sample values outputted from said sampling means in synchronism with a predetermined number of said measurement of a single time;

weighting coefficient generation means for receiving a set of sample values outputted from said sampling means each time said measurement of a single time is made, discriminating the magnitude of respective sample values of the set of sample values and calculating weighting coefficients for each set of sample values obtained for each of the predetermined number of said measurement of a single time;

weighting coefficient storage means for storing said weighting coefficients outputted from said weighting coefficient generation means for a predetermined number of times of measurement of a single time; and weighting means for successively reading out sample values at the same sampling time point each time the measurement of a single time is made and weighting the sample values by weighting coefficients corresponding to said number of times of measurement of a single time stored in said weighting coefficient storage means to conduct an arithmetical mean operation.

2. A digital signal weighting processing apparatus, comprising:

sampling means responsive to a measurement start signal for starting the measurement of an input signal to sample said input signal a predetermined number of times to effect a measurement of a single time and outputting a plurality of sample values obtained by said sampling of said input signal in synchronism with said measurement start signal each time said measurement of a single time is made;

sample value storage means for storing sample values outputted from said sampling means in synchronism with said measurement of a single time;

weighting coefficient generation means for receiving sample values outputted from said sampling means each time said measurement of a single time is made, discriminating the magnitude of respective sample values and calculating weighting coefficients for each measurement of a single time;

weighting coefficient storage means for storing said weighting coefficients of each measurement of a single time outputted from said weighting coefficient generation means for a predetermined number of times of measurement of a single time; and weighting means for successively reading out sample values at the same sampling time point each time the measurement of a single time is made and weighting the sample values by weighting coefficients corresponding to said number of times of measurement of a single time stored in said weighting coefficient storage means to conduct an arithmetical mean operation, wherein said weighting coefficient generation means comprises:

a register for storing sample values obtained each time said measurement of a single time is made;

level decision means for comparing each of sample values stored in said register with a predetermined threshold value, outputting "0" for each sample value larger than the predetermined threshold value, and outputting "1" for each sample value smaller than the predetermined threshold value; and AND operation means for applying an AND operation to said sample values outputted from said level decision means and for outputting weighting coefficients.

3. A digital signal weighting processing apparatus comprising:

sampling means responsive to a measurement start signal for starting the measurement of an input signal to sample said input signal a predetermined number of times to effect a measurement of a single time and outputting a plurality of sample values obtained by said sampling of said input signal in synchronism with said measurement start signal each time said measurement of a single time is made;

sample value storage means for storing sample values outputted from said sampling means in synchronism with said measurement of a single time;

weighting coefficient generation means for receiving sample values outputted from said sampling means each time said measurement of a single time is made, discriminating the magnitude of respective sample values and calculating weighting coefficients for each measurement of a single time;

weighting coefficient storage means for storing said weighting coefficients of each measurement of a single time outputted from said weighting coefficient generation means for a predetermined number of times of measurement of a single time; and weighting means for successively reading out sample values at the same sampling time point each time the measurement of a single time is made and weighting the sample values by weighting coefficients corresponding to said number of times of measurement of a single time stored in said weighting coefficient storage means to conduct an arithmetical mean operation, wherein said weighting coefficient generation means comprises:

a register for storing sample values obtained each time said measurement of a single time is made;

a calculation section for adding sample values stored in said register and for dividing the resultant sum by the number of sample values to calculate a time average value;

a subtraction circuit for outputting values obtained by subtracting said time average value from respective sample values stored in said register;

a square computing circuit for respectively squaring outputs of said subtraction circuit;

a summing circuit for adding outputs of said square computing circuit; and a reciprocal computing circuit for computing the reciprocal of the output of said summing circuit and thereby outputting a weighting coefficient.

4. A digital signal weighting processing apparatus according to claim 3, wherein said weighting coefficient generation means comprises a root computing circuit for calculating the root of the sum output of said summing circuit, and the output of said root computing circuit is outputted to said reciprocal computing circuit.

5. A digital signal weighting processing apparatus according to claim 4, wherein said weighting coefficient generation means further comprises a second subtraction circuit for subtracting signal components of said respective sample values from respective sample values obtained each time said measurement of a single time is made and stored in said register, and wherein respective remainder values of said second subtraction circuit are inputted to said calculation section to calculate a temporal mean value, and said temporal mean value is subtracted from respective outputs of said second subtraction circuit in said subtraction circuit.

6. A digital signal weighting processing apparatus according to claim 3, wherein said weighting coefficient generation means further comprises a second subtraction circuit for subtracting signal components of said respective sample values from respective sample values obtained each time said measurement of a single time is made and stored in said register, and wherein respective remainder values of said second subtraction circuit are inputted to said calculation section to calculate a temporal mean value, and said temporal mean value is subtracted from respective outputs of said second subtraction circuit in said subtraction circuit.

7. A digital signal weighting processing apparatus according to claim 6, wherein said weighting coefficient generation means comprises signal component calculation means for applying an arithmetical mean operation to sample values obtained at the same sampling time point of measurement of each time and stored in said sample value storage means for calculating magnitude values of signal components, and the output of said signal component calculation means is outputted to said second subtraction circuit as signal components.

8. A digital signal weighting processing apparatus comprising:
sampling means responsive to a measurement start signal for starting the measurement of an input signal to sample said input signal a predetermined number of times to effect a measurement of a single time and outputting a plurality of sample values obtained by said sampling of said input signal in synchronism with said measurement start signal each time said measurement of a single time is made;
sample value storage means for storing sample values outputted from said sampling means in synchronism with said measurement of a single time;
weighting coefficient generation means for receiving sample values outputted from said sampling means each time said measurement of a single time is made, discriminating the magnitude of respective sample values and calculating weighting coefficients for each measurement of a single time;
weighting coefficient storage means for storing said weighting coefficients of each measurement of a single time outputted from said weighting coefficient generation means for a predetermined number of times of measurement of a single time; and
weighting means for successively reading out sample values at the same sampling time point each time the measurement of a single time is made and weighting the sample values by weighting coefficients corresponding to said number of times of measurement of a single time stored in said weighting coefficient storage means to conduct an arithmetical mean operation, wherein said weighting coefficient generation circuit further comprises a subtraction circuit for subtracting signal components of respective sample values from respective sample values obtained each time said measurement of a single time is made and stored in said sample value storage means, and the magnitude of each remainder value of said subtraction circuit is discriminated.

9. A digital signal weighting processing apparatus comprising:
sampling means responsive to a measurement start signal for starting the measurement of an input signal to sample said input signal a predetermined number of times to effect a measurement of a single time and outputting a plurality of sample values obtained by said sampling of said input signal in synchronism with said measurement start signal each time said measurement of a single time is made;
sample value storage means for storing sample values outputted from said sampling means in synchronism with said measurement of a single time;
weighting coefficient generation means for receiving sample values outputted from said sampling means each time said measurement of a single time is made, discriminating the magnitude of respective sample values and calculating weighting coefficients for each measurement of a single time;
weighting coefficient storage means for storing said weighting coefficients of each measurement of a single time outputted from said weighting coefficient generation means for a predetermined number of times of measurement of a single time; and
weighting means for successively reading out sample values at the same sampling time point each time the measurement of a single time is made and weighting the sample values by weighting coefficients corresponding to said number of times of measurement of a single time stored in said weighting coefficient storage means to conduct an arithmetical mean operation, wherein said digital signal weighting processing apparatus further comprises filter means connected to the output stage of said sample value storage means, and said filter means applies filter processing having a desired frequency response to sample values and then supplies the output to said weighting means.

10. A weighting processing method comprising the steps of:
measuring an input signal to generate sample values in a predetermined form upon each input of a measurement start signal;
comparing each of sample values obtained by said each measurement with a predetermined threshold value and thereby generating the value "0" or "1";
applying AND operation to these values each represented by "0" or "1" and generating weighting coefficients for each measurement time;
storing sample values for each measurement time by the number of times of measurement;
reading out said stored sample values at each of the same sampling point of time and weighting said sample values thus read out by weighting coefficients of said each measurement time; and
applying arithmetical mean operation to weighted sample values.

11. A weighting processing method according to claim 10, wherein said step of comparing sample values with a predetermined threshold value comprises the steps of outputting "0" when the sample value is larger than said threshold value outputting "1" when the sample value is smaller than said threshold value.

12. A weighting processing method according to claim 10, wherein the step of generation of said weighting coefficients comprises the steps of:
dividing a sum of said sample values by the number of sample values to derive a quotient;
subtracting said quotient from said respective sample values to generate remainder values;
squaring said respective remainder values and generating a sum of said squared remainder values; and
computing the reciprocal of said sum of said squared remainder values.

13. A weighting processing method according to claim 12, further comprising the step of calculating the root of said sum of squared remainder value prior to said reciprocal computation.

14. A weighting processing method according to claim 13, wherein said weighting coefficient generation step comprises the steps of:
generating sample values of all measurement times, applying arithmetical mean operation to sample values obtained at the same sampling time point of measurement of each time, and calculating magnitude values of signal components at each sampling time; and
processing remainder values obtained by subtracting magnitude values of said calculated signal components at each sampling time from sample values of said measurement of each time.

15. A weighting processing method according to claim 12, said weighting coefficient generation step comprises the steps of:
generating sample values of all measurement times, applying arithmetical mean operation to sample values obtained at the same sampling time point of measurement of each time, and calculating magnitude values of signal components at each sampling time; and
processing remainder values obtained by subtracting magnitude values of said calculated signal components at each sampling time from sample values of said measurement of each time.

16. A weighting processing method according to claim 10, comprising, prior to comparison with each predetermined threshold value, the steps of: generating sample values of all measurement times, applying arithmetical mean operation to sample values obtained at the same sampling time point of measurement of each time, and calculating magnitude values of signal components at each sampling time; and
processing remainder values obtained by subtracting magnitude values of said calculated signal components at each sampling time from sample values of said measurement of each time.

17. A signal averager for obtaining an average waveform of measured signals obtained through plural time measurements, the signal averager comprising:
i) sampling means for successively sampling each of the measured signals and outputting serial sample values for each time of said plural time measurements;
ii) sample value storage means for storing a plurality of sets of said serial sample values, respective sets being indicative of waveforms of the measured signals measured at respective times of the measurements;
iii) weighting coefficients generation means for receiving the serial sample values outputted from said sampling means for each time of the measurements, discriminating the magnitudes of respective sample values and calculating a weighting coefficient for each set of said sample values;
iv) weighting coefficient storage means for storing a plurality of values of the weighting coefficient respectively calculated in said weighting coefficient generation means for the respective sets of said serial sample values;
v) weighting means for reading out respective sample values of respective sets of said serial sample values from said sample value storage means and weighting the sample values by respective values of the weighting coefficient corresponding to respective sets of said serial sample values; and
vi) calculating means for successively calculating arithmetical mean values of respective groups of weighted sample values to obtain data indicating the average waveform, each group being composed of values sampled at the same sampling time point in respective times of the measurements and weighted by said weighting means.

18. A signal averager according to claim 17, wherein said weighting coefficient generation means comprises:
a register for storing sample values obtained each time said plural time measurement is made;
level decision means for comparing each of sample values stored in said register with a predetermined threshold value, outputting "0" for each sample value larger than the predetermined threshold value, and outputting "1" for each sample value smaller than the predetermined threshold value; and
AND operation means for applying an AND operation to said sample values outputted from said level decision means for outputting weighting coefficients.

19. A signal averager according to claim 17, wherein said weighting coefficient generation means comprises:
a register for storing samples values obtained each time said plural time measurement is made;
a calculation section for adding sample values stored in said register and for dividing the resultant sum by the number of sample values to calculate a time average value;
a subtraction circuit for outputting values obtained by subtracting said time average value from respective sample values stored in said register;
a square computing circuit for respectively squaring outputs of said subtraction circuit;
a summing circuit for adding outputs of said square computing circuit; and
a reciprocal computing circuit for computing the reciprocal of the output of said summing circuit and thereby outputting a weighting coefficient.

20. A signal averager according to claim 19, wherein said weighting coefficient generation means comprises a root computing circuit for calculating the root of the sum output of said summing circuit, and the output of said root computing circuit is outputted to said reciprocal computing circuit.

21. A signal averager according to claim 20, wherein said weighting coefficient generation means further comprises a second subtraction circuit for subtracting signal components of said respective sample values from respective sample values obtained each time said plural time measurement is made and stored in said register, and wherein respective remainder values of said second subtraction circuit are inputted to said calculation section to calculate a temporal mean value, and said temporal mean value is subtracted from respective outputs of said second subtraction circuit in said subtraction circuit.

22. A signal averager apparatus according to claim 19, wherein said weighting coefficient generation means further comprises a second subtraction circuit for subtracting signal components of said respective sample values from respective sample values obtained each time said plural time measurement is made and stored in said register, and wherein respective remainder values of said second subtraction circuit are inputted to said calculation section to calculate a temporal mean value, and said temporal mean value is subtracted from respective outputs of said second subtraction circuit in said subtraction circuit.

23. A signal averager according to claim 22, wherein said weighting coefficient generation means comprises signal component calculation means for applying an arithmetical mean operation to sample values obtained at the same sampling time point of measurement of each time and stored in said sample value storage means for calculating magnitude values of signal components, and the output of said signal component calculation means is outputted to said second subtraction circuit as signal components.

24. A signal averager according to claim 17, wherein said weighting coefficient generation means further comprises a subtraction circuit for subtracting signal components of respective sample values from respective sample values obtained each time said plural time measurement is made and stored in said register, and the magnitude of each remainder value of said subtraction circuit is discriminated.

25. A signal averager according to claim 17, further comprising filter means connected to the output stage of said sample value storage means for applying filter processing having a desired frequency response to respective sets of said serial sample values to produce a processing result and then supplying said processing result to said weighting means.

* * * * *